United States Patent
Matsuda et al.

(10) Patent No.: US 7,218,038 B2
(45) Date of Patent: May 15, 2007

(54) SURFACE ACOUSTIC WAVE ELEMENT, AND SURFACE ACOUSTIC WAVE DEVICE INCLUDING THE SAME

(75) Inventors: Takashi Matsuda, Kawasaki (JP); Jun Tsutsumi, Kawasaki (JP); Shogo Inoue, Kawasaki (JP); Masanori Ueda, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 226 days.

(21) Appl. No.: 10/852,104

(22) Filed: May 25, 2004

(65) Prior Publication Data

US 2004/0251792 A1 Dec. 16, 2004

(30) Foreign Application Priority Data

May 26, 2003 (JP) .............................. 2003-148313

(51) Int. Cl.
*H01L 41/047* (2006.01)
(52) U.S. Cl. .................................. 310/364; 310/313 B
(58) Field of Classification Search ................ 310/364, 310/363, 365, 366, 313 R, 313 A, 313 B, 310/313 C, 313 D, 312
See application file for complete search history.

(56) References Cited

U.S. PATENT DOCUMENTS 5,909,156 A * 6/1999 Nishihara et al. ........... 333/193
6,154,940 A * 12/2000 Onishi et al. ............... 29/25.35
6,359,368 B1 * 3/2002 Tsutsumi et al. ....... 310/313 D
6,552,475 B2 * 4/2003 Hori et al. .................. 310/364

FOREIGN PATENT DOCUMENTS

| JP | 4-135019 U | 12/1992 |
| JP | 5-206776 | 8/1993 |
| JP | 6-350377 | 12/1994 |
| JP | 7-99420 | 4/1995 |
| JP | 7-122961 | 5/1995 |
| JP | 2003-298382 A | 10/2003 |

* cited by examiner

*Primary Examiner*—Darren Schuberg
*Assistant Examiner*—Derek Rosenau
(74) *Attorney, Agent, or Firm*—Arent Fox LLP

(57) ABSTRACT

A surface acoustic wave element includes: metal patterns that include interdigital transducers, each of the metal patterns being formed with a first alloy or multi-layer film of metals having different standard electrode potentials; and metal films each formed with a second alloy or multi-layer film containing metals having different standard electrode potentials from the standard electrode potentials of the metals forming the first alloy or multi-layer film, the metal films being formed at least on a part of the regions other than the regions corresponding to the electrode fingers of the interdigital transducers of all the metal patterns that are electrically independent of one another.

9 Claims, 12 Drawing Sheets

SURFACE ACOUSTIC WAVE ELEMENT, AND SURFACE ACOUSTIC WAVE DEVICE INCLUDING THE SAME

BACKGROUND OF THE INVENTION

1. Field of the Invention

The present invention generally relates to a surface acoustic wave element and a surface acoustic wave device including the surface acoustic wave element, and more particularly, to a surface acoustic wave element that can avoid corrosion at the time of dicing, and a surface acoustic wave device including the surface acoustic wave element.

2. Description of the Related Art

Surface acoustic wave (SAW) devices for filters and resonators utilizing SAW elements are characteristically small in size and inexpensive, and therefore, are widely used for the band-pass filters of portable telephone devices, or the like.

Along with mobile communication devices such as portable telephone devices with higher performances, there is an increasing demand for higher-performance SAW filters. Especially, duplexers and antenna filters are expected to be smaller and to have higher power durability.

So as to achieve higher power durability, the interdigital transducers of a SAW filter are normally made of an aluminum (Al) alloy that has a small density and has a low electrical resistance. In a duplexer or an antenna filter, for example, an aluminum alloy formed by adding an element, such as titanium (Ti), lead (Pb), copper (Cu), niobium (Nb), or magnesium (Mg), to aluminum, is employed. Japanese Unexamined Patent Publication No. 5-206776 discloses a structure that employs such an aluminum alloy. Also, a multi-layer film that is formed by combining aluminum (Al) with another metal may be employed to reduce insertion loss. Example structures that employ such a multi-layer film are disclosed in Japanese Unexamined Patent Publication Nos. 7-122961 and 6-350377.

Conventionally, a SAW element is electrically connected to a package by a wire bonding technique utilizing wires made of aluminum (Al), or the like. In recent years, however, a flip-chip mounting technique utilizing bumps or soldering balls is often employed so as to produce small-sized SAW devices. Japanese Unexamined Patent Publication No. 7-99420 discloses a structure that employs such a flip-chip mounting technique.

FIG. 1 illustrates a conventional SAW element 100. As shown in FIG. 1, the SAW element 100 is a two-stage ladder SAW filter that has four one-port resonators 110 formed on a device substrate (a piezoelectric substrate) 102 made of a piezoelectric material such as lithium tantalate (hereinafter referred to as LT), lithium niobate (hereinafter referred to as LN), or crystal quartz. Each of the resonators 110 includes an IDT 111 and two reflectors 112 sandwiching the IDT 111 in the SAW propagating direction. Two of the four resonators 110 are arranged in a series arm, and the other two of the four resonators 110 are arranged in a parallel arm with interconnections 114.

The IDTs 111 and the interconnections 114 are made of the same electrode material and are integrally formed. Also, electrode pads 113 for inputting and outputting signals are made of the same material as the IDTs 111, and are integrally formed with the IDTs 111. The electrode material may be an aluminum alloy formed by adding approximately 1% of copper (Cu) to aluminum (Al). If the SAW filter 100 is produced as a 1.9 GHz band filter, for example, the film thickness of each IDT 111 is approximately 180 nm. However, the film thickness can be varied with the frequencies of SAW filters. In the above structure, a metal film (such as a film made of gold (Au)) with low electric resistance is laminated on the joining surface (or the bonding surface) of each electrode pad 113, so as to increase the strength of each electrode pad 113 to which wires, bumps, or soldering balls, are connected. Specifically, wettability of solder can be improved in putting gold (Au) film onto bonding pad 113.

In a case where a gold film is laminated on an electrode pad, however, the electric resistance between the joining surfaces increases with time, because intermetal bonding occurs between aluminum (Al) and gold (Au). As a result, the power durability decreases, and the insertion loss increases.

So as to solve this problem, a metal film made of titanium (Ti), chromium (Cr), or the like, is formed as a barrier metal between an aluminum film and a gold film, so that direct bonding of aluminum (Al) and gold (Au) can be prevented. Especially, if titanium (Ti) or chromium (Cr) is employed, the adhesive strength between aluminum (Al) and gold (Au) can be effectively increased.

As described above, so as to increase power durability, a single-layer film formed with an aluminum alloy or a multi-layer film including a film containing aluminum (Al) as the main component and a film containing another metal as the main component is formed at least on each electrode pad 113 on the piezoelectric substrate 102.

In a case where a single-layer film or a multi-layer film containing aluminum (Al) and another metal is employed, however, corrosion occurs due to a galvanic effect between aluminum (Al) and the other metal in cutting water (normally pure water) when a wafer of a multiple-chip structure is diced to obtain SAW elements. The reason of this is that the standard electrode potential of aluminum ($Al^{3+}$, to be more specific) is −1.66 V, which is much lower than the standard electrode potential of the other metal such as copper (Cu: the standard electrode potential of $Cu^{2+}/Cu^+$ is +0.34 V/+0.52 V). With such a low standard electrode potential, aluminum (Al) is ionized, or melts, in the presence of any of most other metals.

So as to solve this problem, an organic film may be applied by spin-coating in the process immediately before dicing, or a protection film such as an insulating film made of silicon oxide ($SiO_2$) or silicon nitride (SiN) may be formed on each IDT to be protected from corrosion by a film forming technique such as sputtering or vapor deposition.

However, the characteristics of a SAW device greatly vary with the conditions of its surfaces. Especially, in a case where a heavy film is applied, the insertion loss increases, and the filter characteristics deteriorate. Therefore, in the case where an organic film is added so as to prevent the galvanic effect at the time of dicing, the step of removing the organic film from each chip with cleansing liquid needs to be carried out after the dicing step, and the production process becomes more complicated. As a result, the production cost per chip increases.

In the case where an insulating film is formed as a protection film on each IDT, the insulating film has greater influence on the SAW element in a higher frequency band. So as to restrict adverse influence, the insulating film needs to be made as thin as possible. With a thin insulating film, however, holes might appear in the insulating film, and the coverage ratio of each IDT might decrease. If each IDT is not completely covered with an insulating film, corrosion might occur through contact with water. So as to avoid this, the insulating film needs to be thick, though a thick insulting film adversely affects the filter characteristics to a certain extent.

SUMMARY OF THE INVENTION

It is therefore an object of the present invention to provide a surface acoustic wave element and a surface acoustic wave device in which the above disadvantage is eliminated.

A more specific object of the present invention is to provide a surface acoustic wave element that can efficiently avoid corrosion of interdigital transducers, and a surface acoustic wave device including such a surface acoustic wave element.

The above objects of the present invention are achieved by a surface acoustic wave element comprising: metal patterns that include interdigital transducers, each of the metal patterns being formed with a first alloy or multi-layer film of metals having different standard electrode potentials; and metal films each formed with a second alloy or multi-layer film containing metals having different standard electrode potentials from the standard electrode potentials of the metals forming the first alloy or multi-layer film, the metal films being formed at least on a part of regions other than the regions corresponding to the electrode fingers of the interdigital transducers of all the metal patterns that are electrically independent of one another.

The above objects of the present invention are also achieved by a surface acoustic wave element comprising: metal patterns that include interdigital transducers, each of the metal patterns being formed with a first alloy or multi-layer film of metals having different standard electrode potentials; and metal films each containing a metal that has a lower standard electrode potential than one of the metals that is the main component, the metal films being formed at least on a part of regions other than the regions corresponding to the electrode fingers of the interdigital transducers of all the metal patterns that are electrically independent of one another.

The above objects of the present invention are also achieved by a surface acoustic wave device comprising: a surface acoustic wave element; and a package that accommodates the surface acoustic wave element, the surface acoustic wave element in a face-up state being wire-bonded to the package, and the surface acoustic wave element including: metal patterns that include interdigital transducers, each of the metal patterns being formed with a first alloy or multi-layer film of metals having different standard electrode potentials; and metal films each formed with a second alloy or multi-layer film containing metals having different standard electrode potentials from the standard electrode potentials of the metals forming the first alloy or multi-layer film, the metal films being formed at least on a part of regions other than the regions corresponding to the electrode fingers of the interdigital transducers of all the metal patterns that are electrically independent of one another.

The above objects of the present invention are also achieved by a surface acoustic wave device comprising: a surface acoustic wave element; and a package that accommodates the surface acoustic wave element, the surface acoustic wave element in a face-down state being flip-chip mounted onto the package, and the surface acoustic wave element including: metal patterns that include interdigital transducers, each of the metal patterns being formed with a first alloy or multi-layer film of metals having different standard electrode potentials; and metal films each formed with a second alloy or multi-layer film containing metals having different standard electrode potentials from the standard electrode potentials of the metals forming the first alloy or multi-layer film, the metal films being formed at least on a part of regions other than the regions corresponding to the electrode fingers of the interdigital transducers of all the metal patterns that are electrically independent of one another.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

The following is a description of embodiments of the present invention, with reference to the accompanying drawings.

(First Embodiment)

Figure 1:
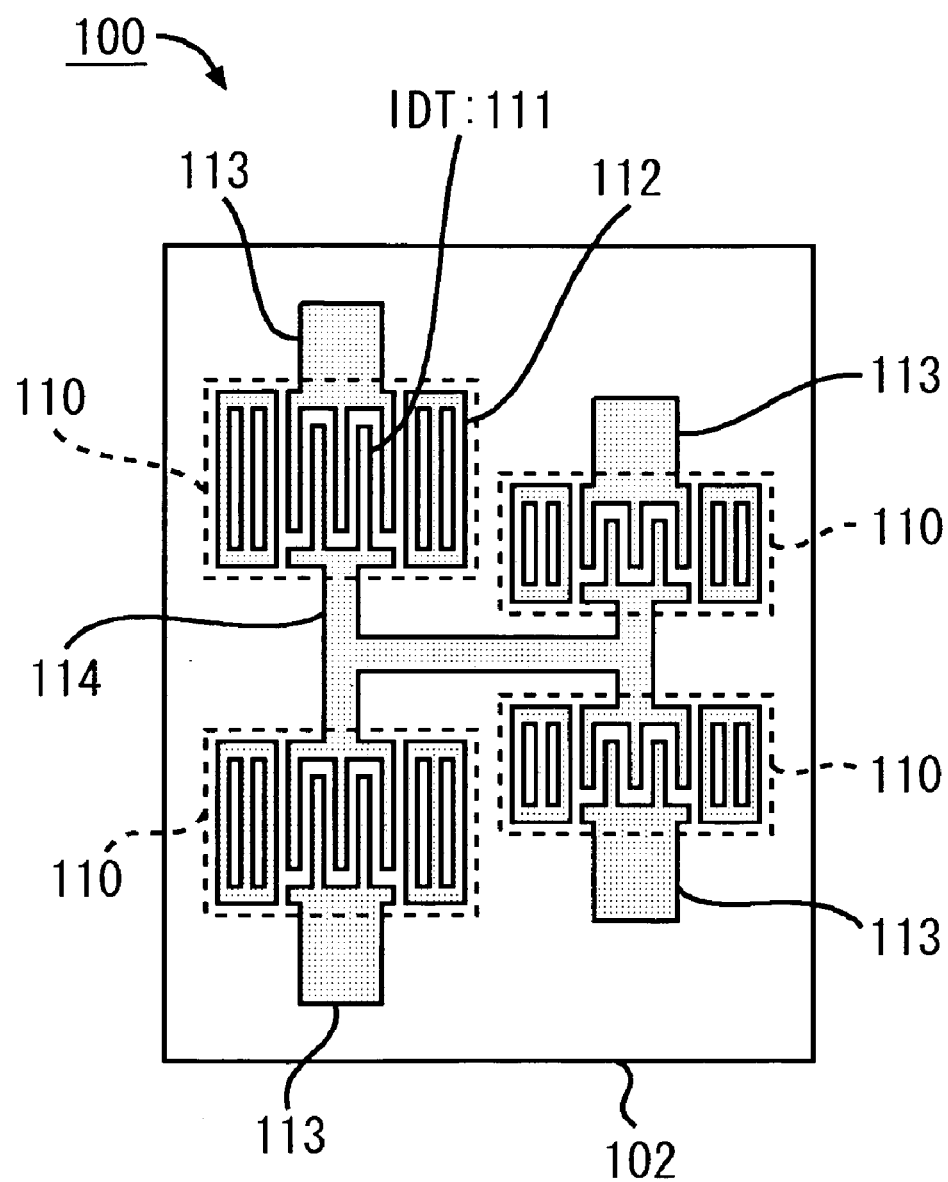
FIG. 1 is a top view of a conventional SAW element.
Figure 2A:
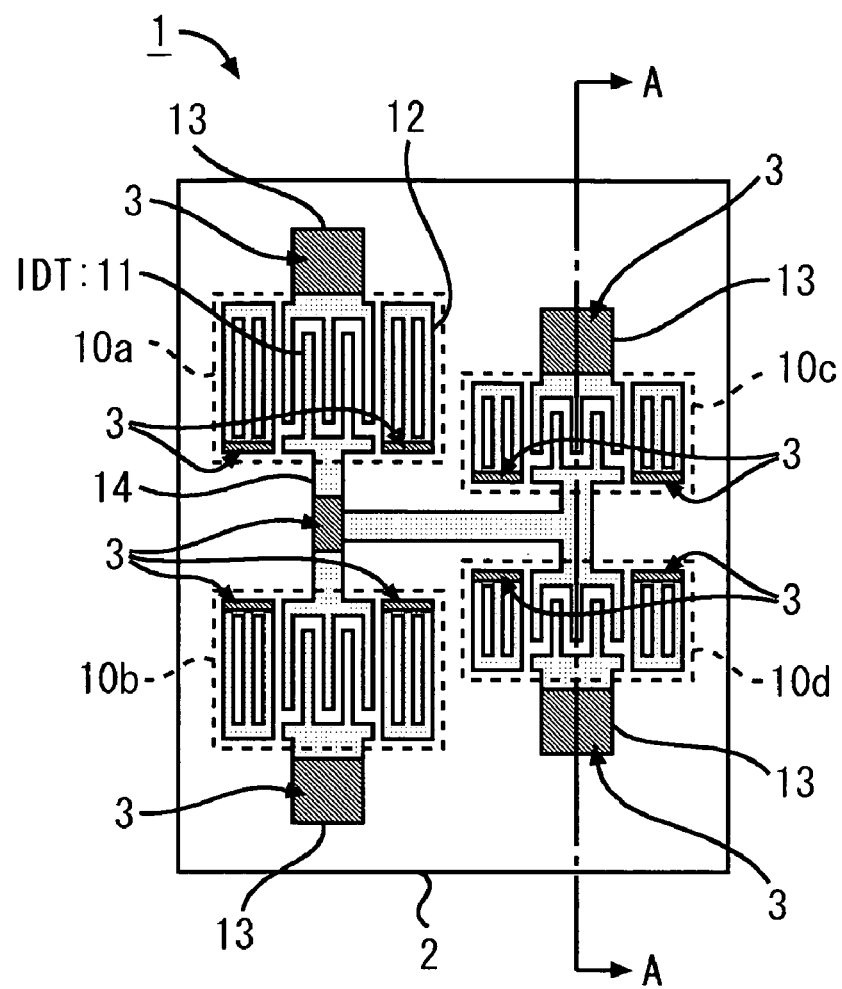
FIG. 2A is a top view of a SAW element in accordance with a first embodiment of the present invention.
Figure 2B:
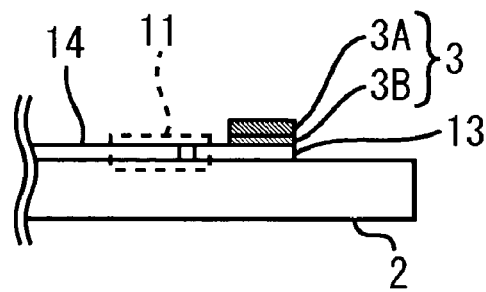
FIG. 2B is a partial section view of the SAW element, taken along the line A—A of FIG. 2A.

Referring first to FIGS. 2A and 2B, a first embodiment of the present invention will be described. FIG. 2A is a top view of a SAW element 1 in accordance with this embodiment. FIG. 2B is a partial section view of the SAW element 1, taken along the line A—A of FIG. 2A.

As shown in FIG. 2A, the SAW element 1 has metal patterns formed on the principal surface of a piezoelectric substrate 2 that is made of lithium tantalate (LT), lithium niobate (LN), crystal quartz, or the like. Each of the metal patterns includes an interdigital transducer 11, reflectors 12, an electrode pad 13, and an interconnection 14.

In each of the metal patterns, the IDT 11 and a pair of reflectors 12 that are arranged to sandwich the IDT 11 in the SAW propagating direction form a resonator (10a through 10d) with the external layer of the piezoelectric substrate 2. The resonators 10a and 10b are connected in a series arm with the interconnection 14. The resonators 10a and 10b are also referred to as series-arm resonators. The resonators 10c and 10d are connected in a parallel arm with the wire 14. The resonators 10c and 10d are also referred to as parallel-arm resonators. In FIG. 2A, the SAW element 1 is shown as a two-stage ladder filter that includes two series-arm resonators and two parallel-arm resonators.

Among the resonators 10a through 10d, the resonators that are located at the signal input and output stages and at the ground input and output stages (which are all the resonators 10a through 10d in the structure shown in FIGS. 2A and 2B) each has an electrode pad 13. Each electrode pad 13 is wire-bonded or flip-chip connected to a signal pad or a ground pad provided on a package (not shown), so that the SAW element 1 is electrically connected to the package.

The IDTs 11, the electrode pads 13, and the interconnections 14 of the resonators 10a through 10d are made of the same metal(s), and are integrally formed as one layer. In this embodiment, an aluminum (Al) layer that contains 1% of copper (Cu) is employed. Other than that, it is possible to employ an aluminum alloy layer formed by adding an element, such as titanium (Ti), lead (Pb), niobium (Nb), or magnesium (Mg), to aluminum (Al), or a multi-layer film formed by combining an aluminum (Al) layer with another metal layer. A metal pattern formed with such an aluminum layer has a small density and low electrical resistance. Accordingly, higher power durability can be obtained, and the insertion loss can be reduced.

The reflectors 12 are also made of the same metal. Accordingly, the IDTs 11, the reflectors 12, the electrode pads 13, and the interconnections 14, can be formed through a single process utilizing a processing technique such as photolithography.

In a case where each metal pattern including one IDT 11 is formed with an aluminum layer containing copper (Cu), however, the aluminum layer melts due to a galvanic effect caused by the difference between the aluminum standard electrode potential (the standard electrode potential of $Al^{3+}$ is $-1.66$ V) and the copper standard electrode potential (Cu: the standard electrode potential of $Cu^{2+}/Cu^+$ is $+0.34$ V/$+0.52$ V). So as to avoid the melting in this embodiment, a structure that generates a different galvanic effect from the galvanic effect (with an electromotive force of 1.66+0.34 (or 0.52)=2.00 (or 2.18) V) caused between aluminum (Al) and copper (Cu) is electrically connected to each metal pattern.

More specifically, metal films are each formed with an alloy film or a multi-layer film containing metals having different standard electrode potentials from the metals contained in the alloy film or the multi-layer film that forms each metal pattern (especially the IDT 11) containing metals (Al and Cu) with different standard electrode potentials. Corrosion resulting from the melting of the electrode fingers at the time of dicing is due to the galvanic action caused by the difference between the standard electrode potentials of the metals forming the electrode fingers. Therefore, metal films to cause a different galvanic effect are formed onto each metal pattern to restrict the galvanic effect. By doing so, corrosion resulting from melting of the metal patterns can be prevented, and excellent filter characteristics can be constantly obtained. In each metal pattern, the electrode fingers of the IDT electrode greatly affect the filter characteristics. Therefore, metal films to avoid corrosion of the electrode fingers should be formed at least on the portions of each metal pattern corresponding to the electrode fingers.

At this point, it is preferable to form the metal films only in regions other than the regions corresponding to the electrode fingers of the IDTs 11 on the metal patterns that are electrically independent of one another. If a heavy film such as a metal film is formed on electrode fingers, the insertion loss increases, and the filter characteristics deteriorate. Therefore, metal films are formed only in regions other than the electrode finger regions in the present invention. In this manner, filter characteristics deterioration can be avoided, and excellent filter characteristics can be realized.

Gold (Au) that is used for increasing the joining strength with metal wires or soldering balls, or for improvement wettability of solder, has a much higher standard electrode potential than aluminum (Al), with the standard electrode potential of $Al^+/Au^{3+}$ being $+1.69$ V/$+1.50$ V. Therefore, films (a single- or multi-layer film) each containing gold (Au) and a metal having a standard electrode potential that is lower than the standard electrode potential of gold (Au) but is higher than the standard electrode potential of aluminum (Al) are provided in contact with a part (at least a region outside the electrode finger regions) of each metal pattern. Here, the electromotive force caused between gold (Au) and the other metal should preferably be greater than the electromotive force caused between aluminum (Al) and copper (Cu). With this structure, melting of aluminum (Al) can be restricted, and filter characteristics deterioration due to corrosion of the metal patterns (especially the electrode fingers of the IDTs 11) can be prevented.

Examples of metals to be laminated or mixed with gold (Au) include titanium (Ti: the standard electrode potential of $Ti^{2+}/Ti^+$ is $-1.61$ V/$-1.21$ V), copper (Cu: the standard electrode potential of $Cu^{2+}/Cu^+$ is $+0.34$ V/$+0.52$ V), lead (Pb: the standard electrode potential of $Pb^{2+}$ is $-0.13$ V), and niobium (Nb: the standard electrode potential of $Nb^{2+}$ is $-1.10$ V). Chromium (Cr: the standard electrode potential of $Cr^{2+}$ is $-0.91$V) may be added or laminated. However, it is possible to employ any other metal having a standard electrode potential that is lower than the standard electrode potential of gold (Au) but is higher than the standard electrode potential of aluminum (Al). Also, the power durability of the SAW element 1 can be increased by employing a metal having high power durability, such as titanium (Ti) or copper (Cu). In the following example case, multi-layer films (the metal films 3) each containing titanium (Ti) and gold (Au) are employed to prevent corrosion of the metal patterns.

FIG. 2B shows the structure of a metal film 3 having a multi-layer structure containing gold (Au) and titanium (Ti) in accordance with this embodiment. As shown in FIG. 2B, the metal film 3 has the metal layer with the lower standard electrode potential, which is a first layer 3B made of titanium (Ti), formed on the corresponding metal pattern (or formed on the electrode pad 13 in FIG. 2B), and the metal layer with the higher standard electrode potential, which is a second layer 3A made of gold (Au), formed on the first layer 3B. As the upper surface of the gold (Au) layer is exposed while the titanium (Ti) layer is located on the joining interface with the metal pattern, the joining strength with metal wires or soldering balls is increased, and solder leakage is prevented. Furthermore, the joining strength between the second layer 3A and the electrode pad 13 is increased. In a case where titanium (Ti) is employed, however, the resistance loss in the first layer 3B might become greater, because the resistivity of titanium (Ti) is higher than aluminum or solder. Therefore, the size of each electrode pad 13 and the size of the metal film 3 to be formed on the electrode pad 13 should be made as large as possible. By doing so, the resistivity in the first layer 3B is made lower, and the insertion loss can be reduced. For example, the second layer 3A of gold may be thicker than the first layer 3B of titanium. This reduces insertion loss and improves the filter characteristics.

Figure 3:
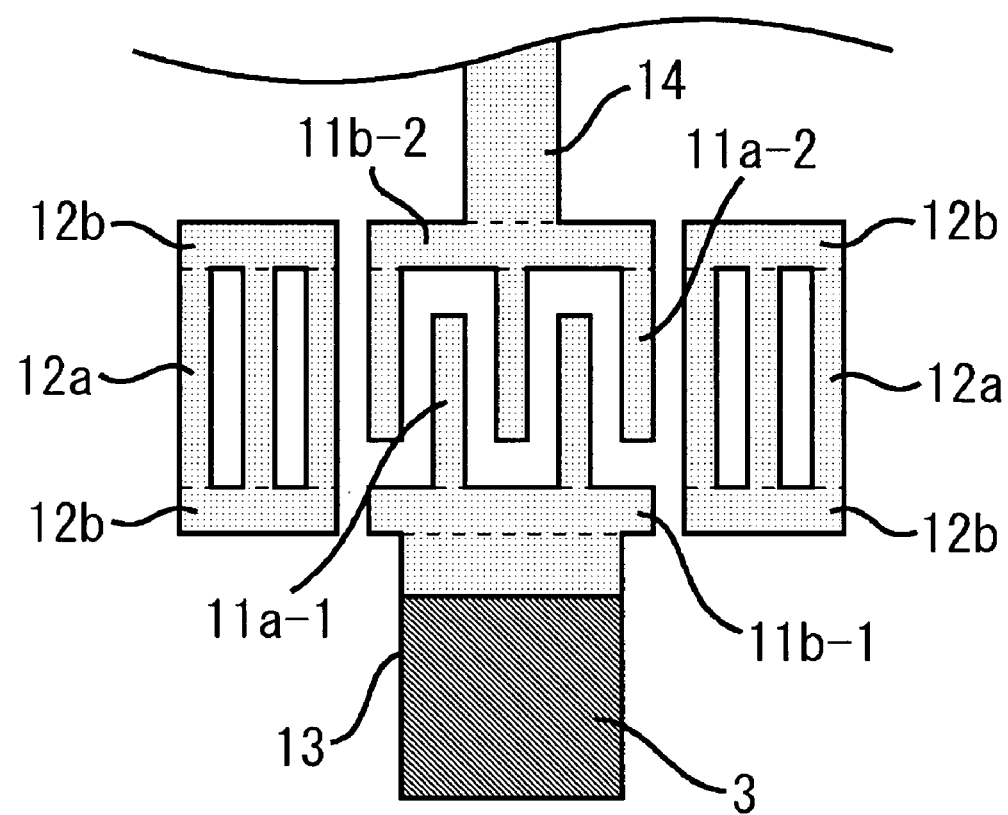
FIG. 3 is an enlarged view of one of the resonators of the SAW element in accordance with the first embodiment.

The metal films 3 are formed not only on the electrode pads 13 in this embodiment, but also on the wires 14 and in regions (the bus bar regions) outside the regions corresponding to the electrode fingers of the reflectors 12. In the enlarged view (showing one of the resonators 10a through 10d) of the SAW element 1 shown in FIG. 3, however, the metal films 3 should preferably be formed in the regions other than the regions corresponding to the electrode fingers 11a-1, 11a-2, and 12a of the IDT 11 and the reflectors 12. If heavy films such as metal films are formed on the electrode fingers 11a-1, 11a-2, and 12a, the insertion loss increases, and the filter characteristics deteriorate. Therefore, the regions in which the metal films 3 can be formed are limited to the region on the electrode pad 13 (which may include a bus bar 11b-1 that connects electrode fingers), the region on the wire 14 (which may include a bus bar 11b-2 that connects electrode fingers), and the regions corresponding to bus bars 12b of the reflectors 12. In other words, the regions in which the metal films 3 can be formed are limited to the regions that do not include the regions corresponding to the electrode fingers 11a-1, 11a-2, and 12a, in the metal pattern.

In the above structure, at least one metal film 3 is formed in each of the metal patterns that are independent of one another on the piezoelectric substrate 2, so that corrosion resulting from a galvanic action can be prevented in all the metal patterns. Thus, excellent filter characteristics can be constantly obtained.

The effects of the SAW element 1 will now be described in detail, with reference to the accompanying drawings. As a comparative example, a SAW element 1' is shown in FIG. 4.

Figure 4:
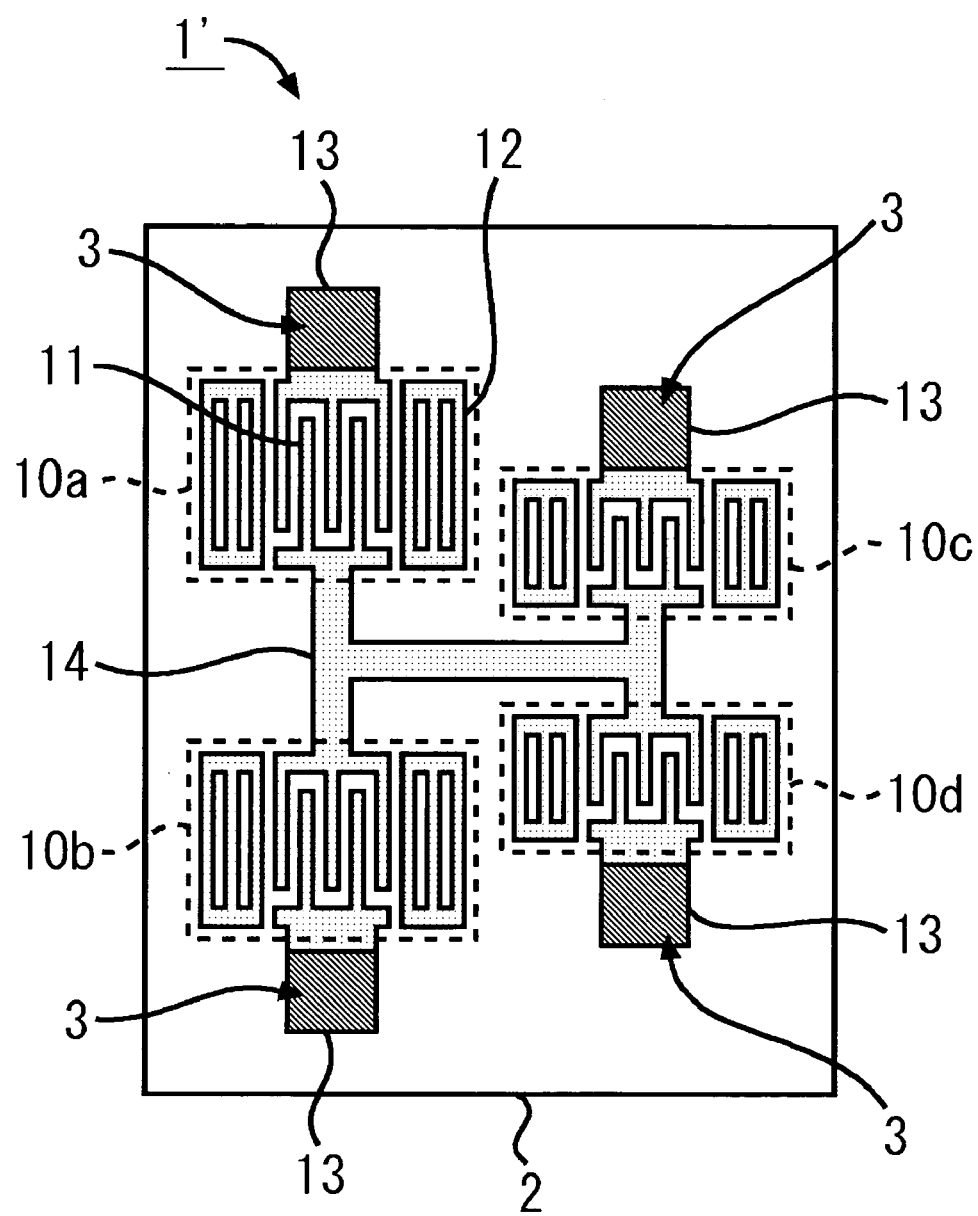
FIG. 4 is a top view of a SAW element as a comparison example of the SAW device of FIG. 2A.

Unlike the SAW element 1 shown in FIG. 2A, the SAW element 1' shown in FIG. 4 does not have the metal films 3 formed on the reflectors 12 and the wires 14. Other than that, the SAW element 1' has the same structure as the SAW element 1. Each of the metal films 3 is formed as a multi-layer film including a second layer 3A that is made of gold (Au) and has a film thickness of 400 nm, and a first layer 3B that is made of titanium (Ti) and has a film thickness of 50 nm. The film formation can be performed by a vapor deposition technique, or the like. In this example, the metal films 3 are patterned on lift-off resist patterns that are formed in advance.

Figure 5:
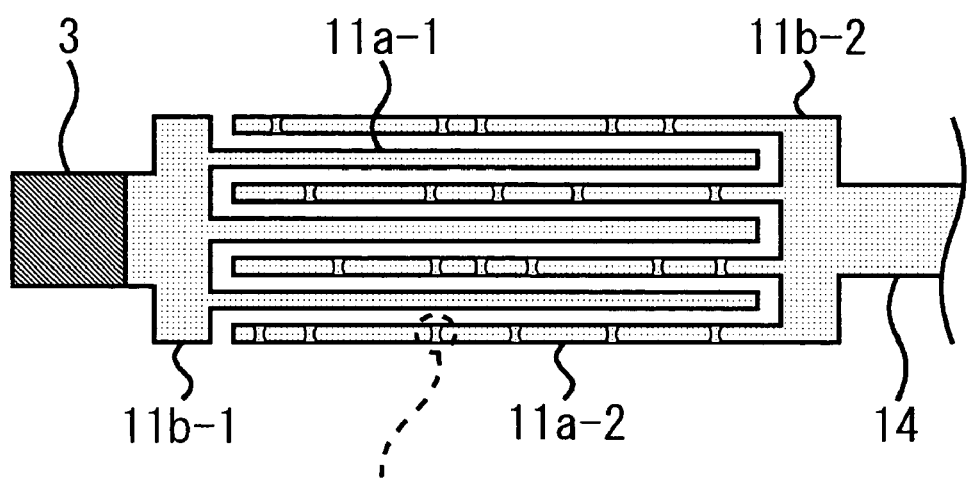
FIG. 5 shows corrosion that occurs after dicing in the SAW element of the comparison example.
Figure 6:
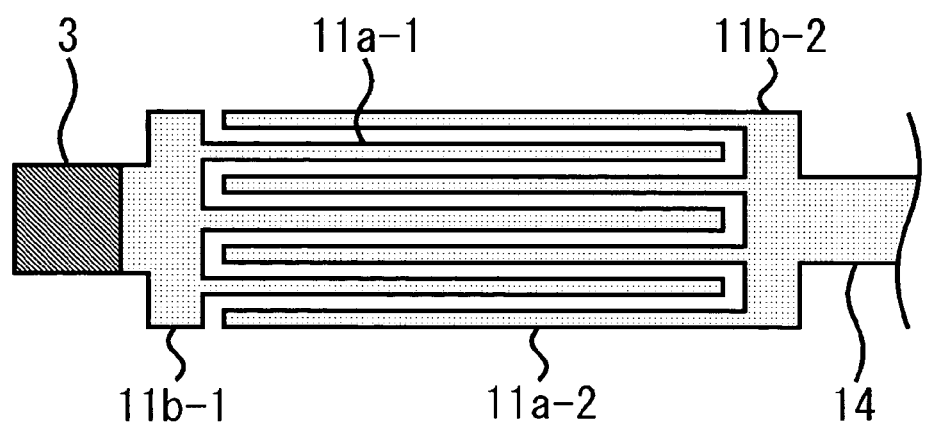
FIG. 6 shows corrosion that occurs after dicing in the SAW element of the first embodiment of the present invention.

FIG. 5 shows corrosion (especially, corrosion of each IDT 11) that is observed after the SAW element 1' shown in FIG. 4 is cut out through a dicing process. FIG. 6 also shows corrosion (especially, corrosion of each IDT 11) that is observed after the SAW element 1 shown in FIG. 2A is cut out through a dicing process. Each of the metal films 3 of the SAW element 1 is also a multi-layer film including the second layer 3A that is made of gold (Au) and has a film thickness of 400 nm, and the first layer 3B that is made of titanium (Ti) and has a film thickness of 50 nm. The dicing is performed with pure water serving as cutting fluid.

As is apparent from FIG. 5, after the SAW element 1' is immersed in the cutting water, corrosion due to aluminum melting is seen in the regions including the wire 14, the bus bar 11b-2, and the electrode fingers 11a-2 that are electrically connected and are not covered with the metal films 3, though corrosion due to aluminum melting is not seen in the regions including the electrode pad 13, the bus bar 11b-1, and the electrode fingers 11a-1 that are electrically connected and are partially covered with the metal films 3. The reason of this is that an electromotive force is generated between aluminum (Al) and copper (Cu) due to a galvanic action. In the metal pattern having the metal films 3, on the other hand, titanium (Ti) that constitutes the first layer 3B, instead of aluminum, melts. Accordingly, corrosion resulting from aluminum melting is not seen in the electrode fingers 11a-1, as shown in FIG. 5. In the SAW element 1 having the metal films 3 on all the metal patterns, corrosion resulting from aluminum melting is not seen at all, as shown in FIG. 6. Judging from the above facts, the formation of the metal films 3 on all the metal patterns leads to excellent filter characteristics. Each one metal pattern that includes a series of components (electrically connected) is also referred to as an island region.

The method of producing the SAW element 1 in accordance with this embodiment will now be described in detail, with reference to the accompanying drawings.

Figure 7A:
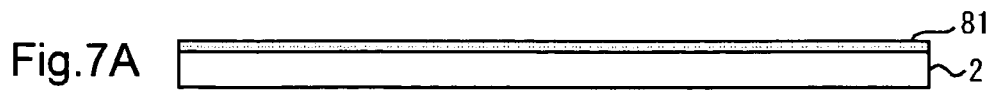
FIGS. 7A through 7I illustrate the production process according to the method of producing the SAW element of the first embodiment of the present invention.
Figure 7B:
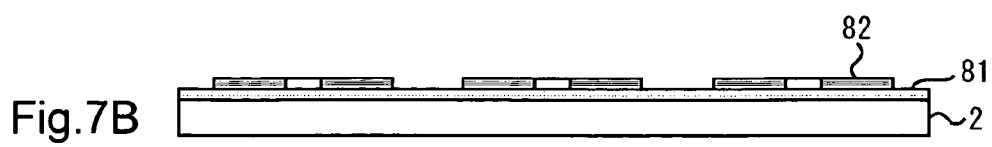
Figure 7C:
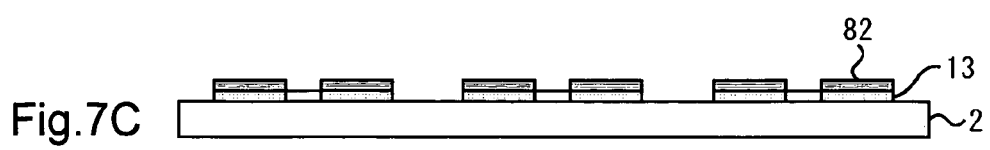

FIGS. 7A through 7I illustrate the production procedures in accordance with this embodiment. As shown in FIG. 7A, a metal film 81 is first formed on the piezoelectric substrate 2 made of a piezoelectric material such as LT or LN. Masks 82 that are to be used for etching the metal film 81 into desired metal patterns are then formed on the metal pattern 81, as shown in FIG. 7B. Etching is carried out on the metal pattern, as shown in FIG. 7C. Here, the masks 82 have the shapes corresponding to the shapes of the metal patterns shown in FIG. 2A.

Figure 7D:
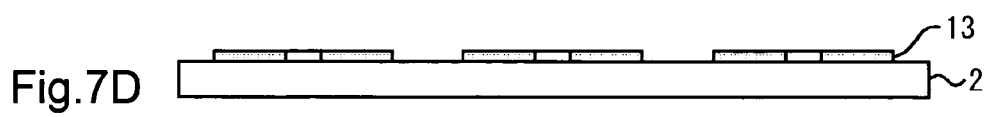
Figure 7E:
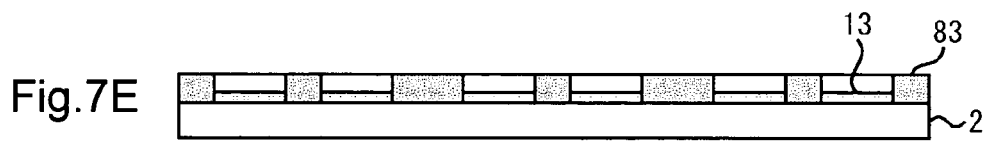
Figure 7F:
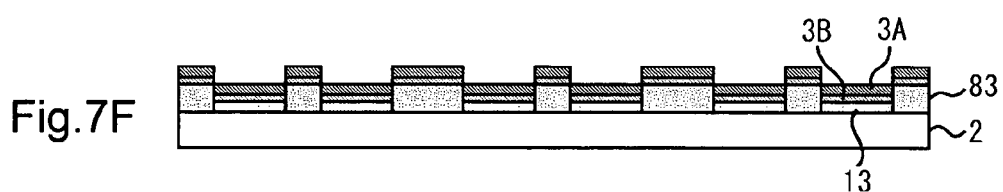
Figure 7G:
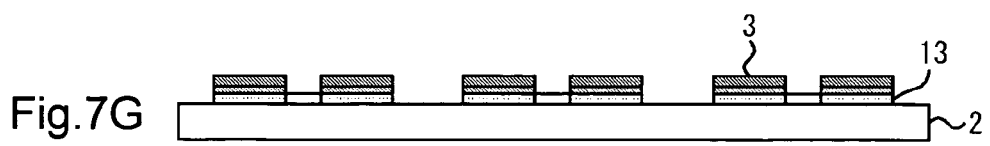

After the etching of the metal film 81 is completed, the masks 82 are removed, as shown in FIG. 7D. Lift-off resist patterns 83 to be used for forming the metal films 3 are then formed, as shown in FIG. 7E. After a titanium film and a gold film are formed through a film growth process, as shown in FIG. 7F, the resist patterns 83 are removed. A first layer 3B and a second layer 3A remain in each of the predetermined regions that have not had the resist patterns 83. Thus, the metal films 3 are formed, as shown in FIG. 7G. Here, the resist patterns 83 have the shapes corresponding to the shapes of the metal films 3 shown in FIG. 2A.

Figure 7H:
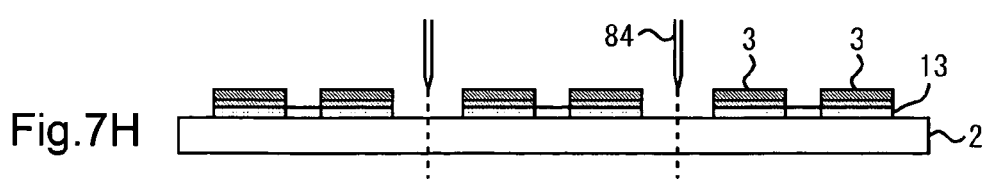
Figure 7I:
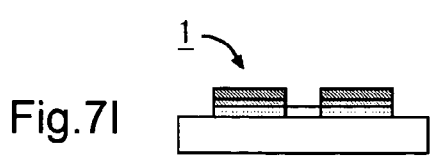

In the above manner, the electrode patterns (including the IDTs 11, the reflectors 12, the electrode pads 13, and the interconnections 14; though only the electrode pads 13 are shown in FIGS. 17C through 17I) that are two-dimensionally arranged on the piezoelectric substrate 2 are produced, as well as the base substrate of a multiple-chip structure having the metal films 3 formed thereon. The base substrate having the multiple-chip structure is then divided into individual SAW elements 1 with dicing blades 84, as shown in FIG. 7H. Here, pure water is used as cutting fluid. In this manner, SAW elements 1 each having the above described effects are produced, as shown in FIG. 7I.

Although the second layer 3A is made of gold (Au) and the first layer 3B is made of titanium (Ti) in this embodiment, the layers 3A and 3B may be made of some other metals. Any metal having a higher standard electrode potential than the standard electrode potential of aluminum (Al) contained as the main component in each IDT 11 may be used for the second layer 3A. Also, any metal having a standard electrode potential that is lower than the standard electrode potential of the metal of the second layer 3A but is higher than the standard electrode potential of aluminum (Al) may be used for the first layer 3B. Here, the structure should preferably be designed in such a manner that the electromotive force generated between the second layer 3A and the first layer 3B is smaller than the electromotive force generated between aluminum (Al) and copper (Cu), as mentioned earlier.

The above described effects of the present invention are obtained with laminated structures (the metal films 3) each including a layer (the second layer 3A) made of a metal (a metal A) having a higher standard electrode potential than aluminum (Al) and a layer (the first layer 3B) made of a metal (a metal B) having a standard electrode potential that is lower than the standard electrode potential of the metal of the second layer 3A but is higher than the standard electrode potential of aluminum (Al). However, the present invention is not limited to such a structure, and the same effects as the above can be obtained with a structure in which an alloy layer formed by mixing the metal B with the metal A or vice versa is provided on each metal pattern.

(Second Embodiment)

Figure 8:
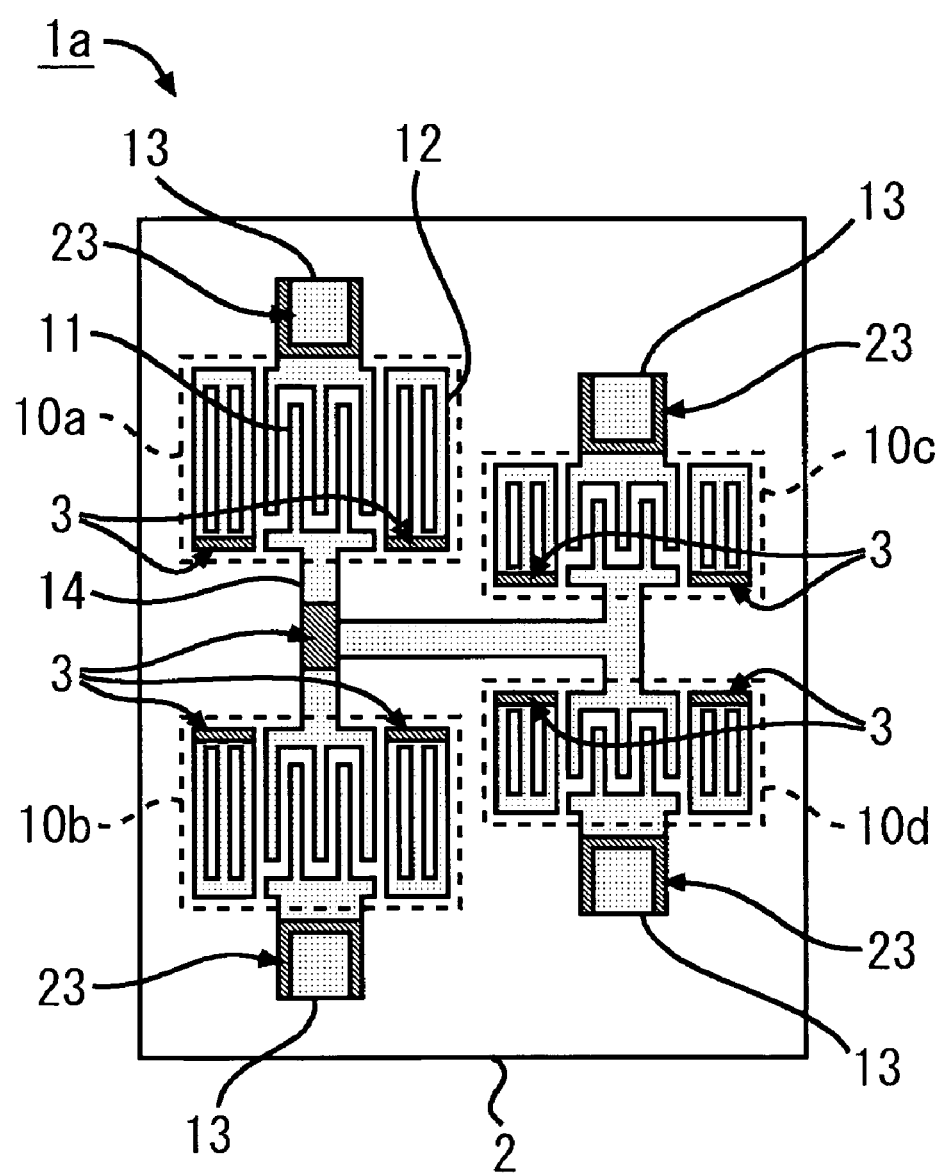
FIG. 8 is a top view of a SAW element in accordance with a second embodiment of the present invention.

Referring now to FIG. 8, a second embodiment of the present invention will be described in detail. FIG. 8 is a top view of a SAW element 1a in accordance with this embodiment.

As shown in FIG. 8, the SAW element 1a of this embodiment differs from the SAW element 1 of the first embodiment in the shape of each metal film (each metal film 23 in this embodiment) formed on the electrode pads 13. More specifically, the center part of each metal film 23 is open, so that the package and each electrode pad 13 are bonded directly to each other with a metal wire, soldering bumps, or gold bumps. The laminated structure of each metal film 23 of this embodiment is the same as the laminated structure of each metal film 3, and the metals contained in each metal film 23 are also the same as the metals contained in each metal film 3.

In a case where a first layer (equivalent to the first layer 3B of the first embodiment) is made of a metal, such as titanium (Ti), which has a greater resistance value than a second layer 23A (equivalent to the second layer 3A of the first embodiment), the corresponding electrode pad 13, a metal wire, soldering bumps, and gold bumps, the resistance loss due to the first layer might become large and adversely affect the filter characteristics. Therefore, each electrode pad 13 is directly connected to a metal wire, soldering bumps, or gold bumps, without the interposition of a metal film (equivalent to the metal film 3 of the first embodiment) in this embodiment. The other aspects of this embodiment are the same as those of the first embodiment, and therefore, explanation of them is omitted herein.

(Third Embodiment)

Figure 9:
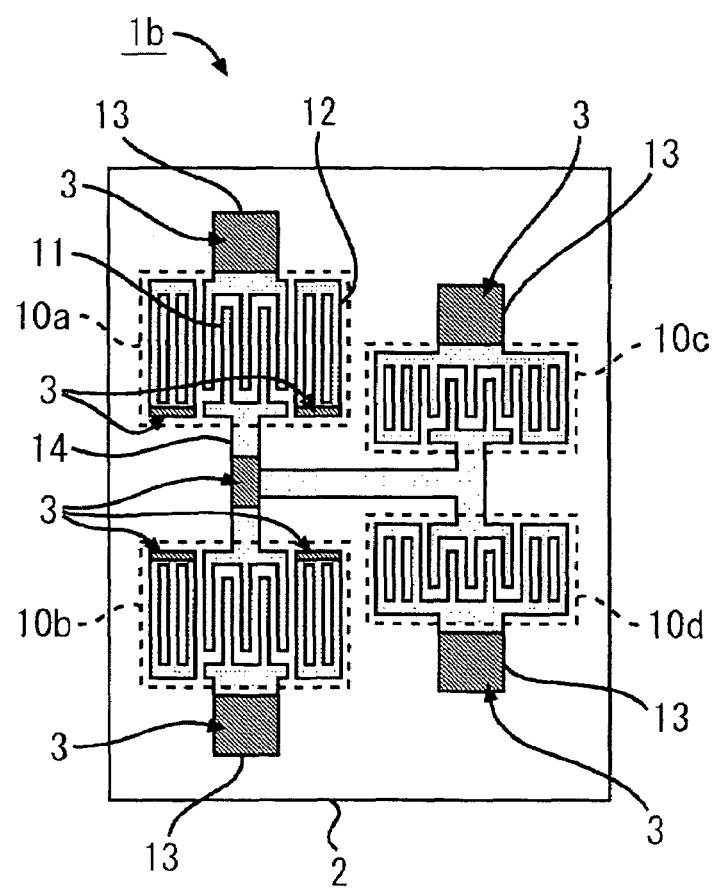
FIG. 9 is a top view of a SAW element in accordance with a third embodiment of the present invention.

Referring now to FIG. 9, a third embodiment of the present invention will be described in detail. FIG. 9 is a top view of a SAW element 1b in accordance with this embodiment.

As shown in FIG. 9, the SAW element 1b of this embodiment differs from the SAW element 1 of the first embodiment in that the bus bar of each reflector (equivalent to each reflector 12 of the first embodiment) that does not affect the filter characteristics is integrally formed with the bus bar of each corresponding IDT (equivalent to each IDT 11 of the first embodiment).

This structure can be applied to the resonators 10c and 10d that are connected in a parallel arm with a wire 14. By doing so, the parts and regions that form the metal films 3 can be reduced in size, and the efficiency in the production and design can be increased. Thus, the production costs can be reduced. The other aspects of this embodiment are the same as those of the first embodiment, and therefore, explanation of them is omitted herein.

(Fourth Embodiment)

Figure 10A:
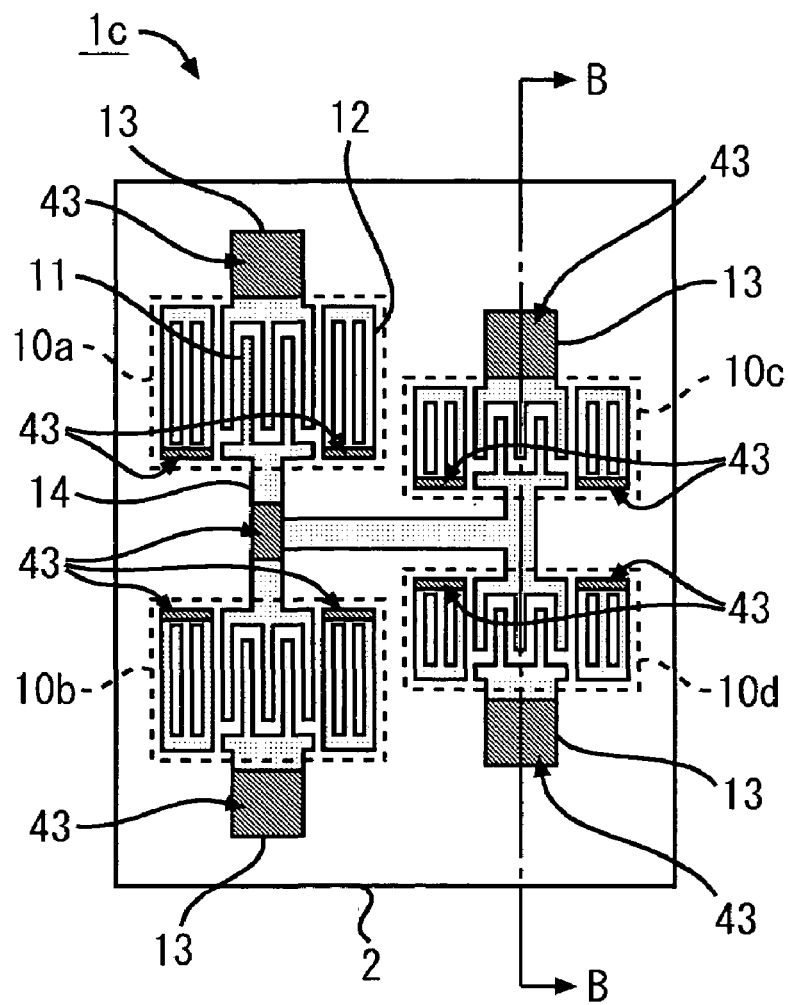
FIG. 10A is a top view of a SAW element in accordance with a fourth embodiment of the present invention.
Figure 10B:
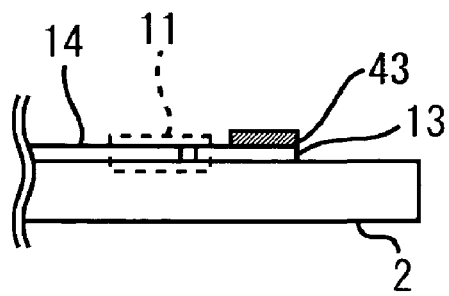
FIG. 10B is a partial section view of the SAW element, taken along the line B—B of FIG. 10A.

Referring now to FIGS. 10A and 10B, a fourth embodiment of the present invention will be described in detail. In each of the foregoing embodiments, melting of a metal C (such as an aluminum (Al) layer containing 1% of copper (Cu)) is prevented by providing each metal pattern with alloy structures or laminated structures each including: a metal A (such as gold (Au)) that has a higher standard electrode potential than the metal C that forms the metal patterns including the IDTs 11, the reflectors 12, the electrode pads 13, and the wires 14; and a metal B (such as titanium (Ti)) having substantially the same standard electrode potential as the metal C, or having a standard electrode potential that is lower than the standard electrode potential of the metal A and is higher than the standard electrode potential of the metal C. In this embodiment, on the other hand, melting of the metal C is prevented by providing each metal pattern with films made of a metal D that has a lower standard electrode potential (or a greater ionization tendency) than the metal C.

FIG. 10A is a top view of a SAW element 1c in accordance with this embodiment. FIG. 10B is a partial section view of the SAW element 1c, taken along the line B—B of FIG. 10A.

As shown in FIG. 10A, the SAW element 1c of this embodiment has the same structure as the SAW element 1 of the first embodiment, except that the metal films 3 are replaced with metal films 43. A section view of one of the metal films 43 is shown in FIG. 10B. As shown in FIG. 10B, each metal film 43 can be formed as a single-layer structure made of the metal D.

As described above, each metal film 43 is made of the metal D that has a lower standard electrode potential than the metal C such as aluminum (Al). The metal D may be magnesium (Mg: the standard electrode potential of $Mg^{2+}$ is $-2.37$ V), rubidium (Rb: the standard electrode potential of $Rb^+$ is $-2.93$ V), strontium (Sr: the standard electrode potential of $Sr^{2+}$ is $-2.89$ V), or silver (Ag: the standard electrode potential of $Ag^{2+}$ is $-1.98$ V). However, any other metal that has a lower standard electrode potential than the metal contained in each metal pattern can be employed as the metal D.

The metal films 43 that are made of a metal having a lower standard electrode potential than the metal forming the metal patterns (especially the electrode fingers of the IDTs 11) are formed on the outer surfaces of the electrically connected metal patterns. In this structure, the metal films 43 melt, and corrosion of the metal patterns can be restricted, because corrosion is normally caused in a metal with the lower standard electrode potential (a base metal). Accordingly, filter characteristics deterioration can be prevented. The other aspects and the production method of this embodiment are the same as those of the foregoing embodiments, and therefore, explanation of them is omitted herein.

(Fifth Embodiment)

Figure 11A:
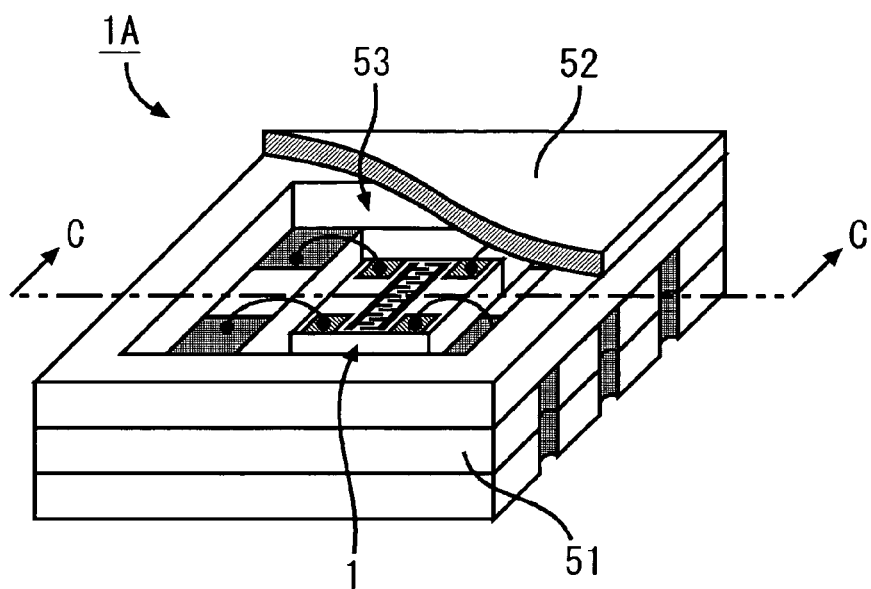
FIG. 11A is a perspective view of a SAW device in accordance with a fifth embodiment of the present invention.
Figure 11B:
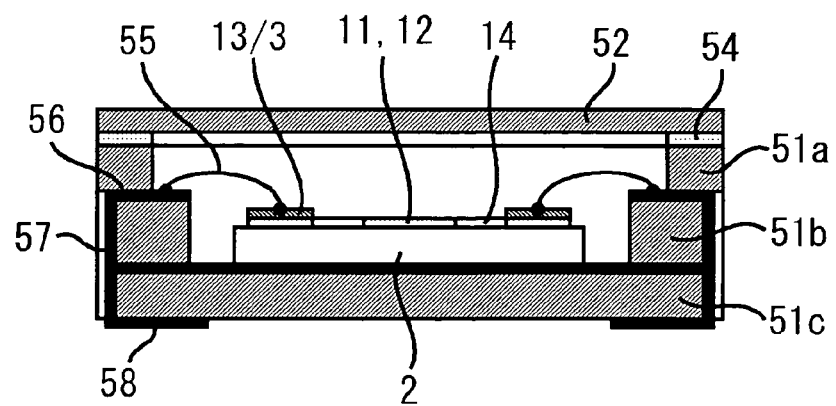
FIG. 11B is a section view of the SAW device, taken along the line C—C of FIG. 11A.

Referring now to FIGS. 11A and 11B, a case where a SAW device (a SAW filter device, for example) is produced with a SAW element (1, 1a, 1b, or 1c) of the foregoing embodiments will be described in detail as a fifth embodiment of the present invention.

FIG. 11A is a perspective view of a SAW device in accordance with this embodiment. FIG. 11B is a section view of the SAW device 1A, taken along the line C—C of FIG. 11A. In the example case described below, the SAW element 1 of the first embodiment is employed.

As shown in FIGS. 11A and 11B, the SAW element 1 is face-up mounted in a cavity 53 formed in a package 51 that includes three layers 51a, 51b, and 51c. In this face-up mounting state, the surface having the metal patterns that include the IDTs 11, the reflectors 12, the electrode pads 13, and the wires 14, faces upward. Electrode pads 56 that connect to the SAW element 1 are formed in the cavity 53 of the package 51. The electrode pads 56 are electrically connected to foot patterns 58 via castellations 57 formed on the outer side walls of the package 51. The foot patterns 58 are formed on the bottom surface of the package 51 (on the surface opposite from the opening surface of the cavity 53). The metal films 3 (43) or the electrode pads 13 of the SAW element 1 are bonded to the electrode pads 56 of the package 51 with metal wires 55, or the like. After the mounting of the SAW element 1, the cavity 53 is hermetically sealed with a metal cap 52, or the like. Here, the package 51 and the metal cap 52 may be joined to each other with a washer 54 made of such a material as resin.

As described above, a SAW element of the present invention is face-up mounted in the cavity of a package and is then wire-bonded to the package, so as to produce the SAW device 1A having excellent filter characteristics.

(Sixth Embodiment)

Figure 12A:
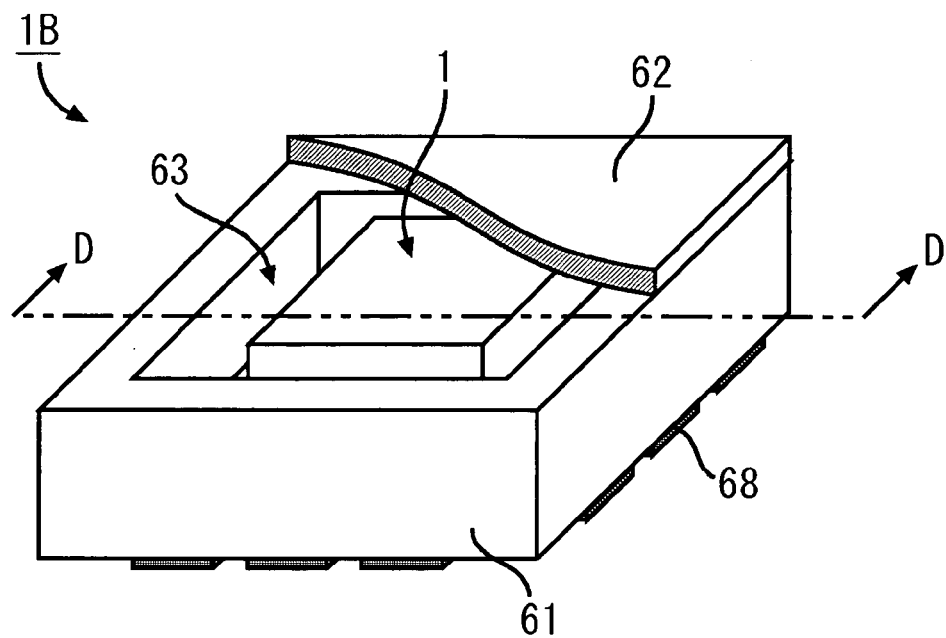
FIG. 12A is a perspective view of a SAW device in accordance with a sixth embodiment of the present invention.
Figure 12B:
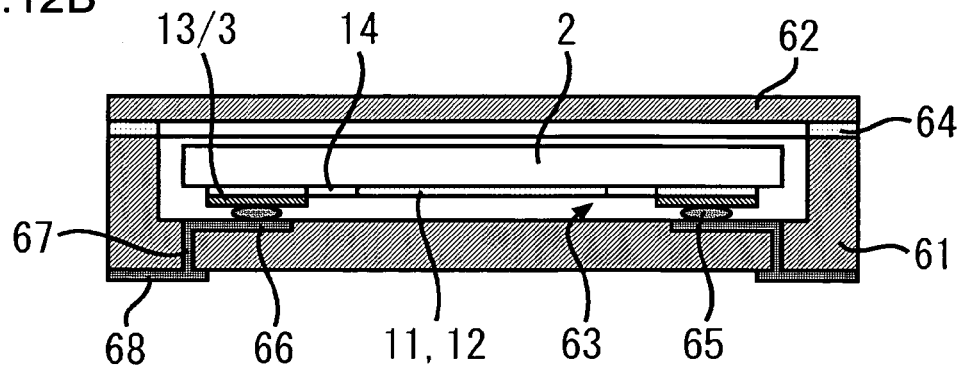
FIG. 12B is a section view of the SAW device, taken along the line D—D of FIG. 12A.

In the fifth embodiment, the SAW device 1A is produced by wire-bonding the SAW element (1, 1a, 1b, or 1c) of one of the foregoing embodiments of the present invention to a package in a face-up state. However, it is also possible to employ a structure in which a SAW element (1, 1a, 1b, or 1c) in a face-down state is flip-chip mounted in the cavity 63 of a package 61, as shown in FIGS. 12A and 12B. In this structure, the metal films 3 (43) or the electrode pads 13 on the SAW element (1, 1a, 1b, or 1c) are bonded to electrode pads 66 formed on the bottom surface (or the die-attach surface) of the cavity 63 with bumps 65 such as soldering bumps or gold bumps. The electrode pads 66 are electrically connected to foot patterns 68 on the bottom surface of the package 61, through via wires 67 penetrating through the package 61. After the mounting of the SAW element (1, 1a, 1b, or 1c), the cavity 63 is hermetically sealed with a metal cap 62, or the like. Here, the package 61 and the metal cap 62 are joined to each other with a washer 64 made of such a material as resin.

As described above, a SAW element of the present invention in a face-down state is flip-chip mounted in the cavity of a package and is then wire-bonded to the package with bumps, so as to produce the SAW device 1B having excellent filter characteristics.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A surface acoustic wave element comprising:
   metal patterns that include interdigital transducers, each of the metal patterns being formed with a first alloy or multi-layer film of metals having different standard electrode potentials; and
   metal films each formed with a second alloy or multi-layer film containing metals having different standard electrode potentials from the standard electrode potentials of the metals forming the first alloy or multi-layer film, the metal films being formed at least on a part of regions other than the regions corresponding to the electrode fingers of the interdigital transducers of all the metal patterns that are electrically independent of one another, wherein
   the metal films are formed in regions other than the regions bonded with wires or bumps in the metal patterns and are separate from conductors provided in the regions bonded with the wires or bumps.

2. The surface acoustic wave element as claimed in claim 1, wherein:
   each of the metal patterns contains a first metal and a second metal;
   each of the metal films contains a third metal and a fourth metal;
   the first metal has a lower standard electrode potential than the second metal;
   the third metal has a higher standard electrode potential than the second metal; and
   the fourth metal has a standard electrode potential that is equal to the standard electrode potential of the second metal, or has a standard electrode potential that is higher than the standard electrode potential of the second metal and is lower than the standard electrode potential of the third metal.

3. The surface acoustic wave element as claimed in claim 2, wherein the difference between the standard electrode potentials of the third metal and the fourth metal is equal to or greater than the difference between the standard electrode potentials of the first metal and the second metal.

4. The surface acoustic wave element as claimed in claim 2, wherein:
   the first metal is aluminum;
   the second metal is copper or titanium;
   the third metal is gold; and
   the fourth metal is titanium or chromium.

5. The surface acoustic wave element as claimed in claim 2, wherein:
   each of the metal films includes a first layer that contains the fourth metal and is formed on each corresponding one of the metal patterns, and a second layer that contains the third metal and is formed on the first layer; and
   the film thickness of the second layer is greater than the film thickness of the first layer.

6. A surface acoustic wave element comprising:
   metal patterns that include interdigital transducers, each of the metal patterns being formed with a first alloy or multi-layer film of metals having different standard electrode potentials; and
   metal films each containing a metal that has a lower standard electrode potential than one of the metals that is the main component, the metal films being formed at least on a part of regions other than the regions corresponding to the electrode fingers of the interdigital transducers of all the metal patterns that are electrically independent of one another,
wherein
   the metal films are formed in regions other than the regions bonded with wires or bumps in the metal patterns and are seiarate from conductors provided in the regions bonded with the wires or bumps.

7. The surface acoustic wave element as claimed in claim 6, wherein:
   the metal that is the main component is aluminum; and the metal having the lower standard electrode potential than the metal that is the main component is magnesium.

8. A surface acoustic wave device comprising:
a surface acoustic wave element; and
a package that accommodates the surface acoustic wave element,
the surface acoustic wave element in a face-up state being wire-bonded to the package, and
the surface acoustic wave element including:
metal patterns that include interdigital transducers, each of the metal patterns being formed with a first alloy or multi-layer film of metals having different standard electrode potentials; and
metal films each formed with a second alloy or multi-layer film containing metals having different standard electrode potentials from the standard electrode potentials of the metals forming the first alloy or multi-layer film, the metal films being formed at least on a part of regions other than the regions corresponding to the electrode fingers of the interdigital transducers of all the metal patterns that are electrically independent of one another, wherein
the metal films being formed in regions other than the regions bonded with wires or bumps in the metal patterns and being separate from conductors provided in the regions bonded with the wires or bumps.

9. A surface acoustic wave device comprising:
a surface acoustic wave element; and
a package that accommodates the surface acoustic wave element,
the surface acoustic wave element in a face-down state being flip-chip mounted onto the package, and
the surface acoustic wave element including:
metal patterns that include interdigital transducers, each of the metal patterns being formed with a first alloy or multi-layer film of metals having different standard electrode potentials; and
metal films each formed with a second alloy or multi-layer film containing metals having different standard electrode potentials from the standard electrode potentials of the metals forming the first alloy or multi-layer film, the metal films being formed at least on a part of regions other than the regions corresponding to the electrode fingers of the interdigital transducers of all the metal patterns that are electrically independent of one another, wherein
the metal films being formed in regions other than the regions bonded with wires or bumps in the metal patterns and being separate from conductors provided in the regions bonded with the wires or bumps.

* * * * *